United States Patent [19]

Tsuchida et al.

[11] Patent Number: 5,084,842
[45] Date of Patent: Jan. 28, 1992

[54] DYNAMIC RANDOM ACCESS MEMORY WITH ENHANCED SENSE-AMPLIFIER CIRCUIT

[75] Inventors: Kenji Tsuchida, Kawasaki; Yukihito Oowaki; Daisaburo Takashima, both of Yokohama, all of Japan

[73] Assignee: Kabushiki Kaisha Toshiba, Kawasaki, Japan

[21] Appl. No.: 536,718

[22] Filed: Jun. 12, 1990

[30] Foreign Application Priority Data

Jun. 13, 1989 [JP] Japan .................................. 1-148448

[51] Int. Cl.⁵ ............................................ G11C 13/00
[52] U.S. Cl. .................................. 365/204; 365/203
[58] Field of Search ............... 365/203, 204, 205, 206, 365/190; 307/530

[56] References Cited

U.S. PATENT DOCUMENTS 4,803,664  2/1989  Itoh ..................................... 365/210

OTHER PUBLICATIONS

Symposium on VLSI Circuits, digest of Tech. papers, P-113-114, May 1989, Daeie Chin et al, "An Experimental 16 Mb DRAM with Reduced Peak-Current Noise".

Symposium on VLSI Circuits, digest of Tech. papers P-103-103, May 1989, J. Okamura et al.; "Decoded--Source Sense Amplifier for High-Density DRAMs".

Primary Examiner—Terrell W. Fears
Attorney, Agent, or Firm—Oblon, Spivak, McClelland, Maier & Neustadt

[57] ABSTRACT

A dynamic random access memory has a substrate, plural pairs of parallel bit lines provided on the substrate, parallel word lines insulatively crossing the parallel bit lines to define cross points therebetween, and memory cells provided at the cross points. Each memory cell has a data storage capacitor and a transistor. Sense amplifiers are provided at bit line pairs, respectively, to sense a data voltage. A discharge control section, which is associated with the sense amplifiers, forms discharge paths branched between the bit line pairs and the substrate grounded to progress the discharging of charges, when a certain word line is designated and a memory cell is selected from those memory cells which are connected to the certain word line, whereby the operational speed of the memory is increased.

14 Claims, 5 Drawing Sheets

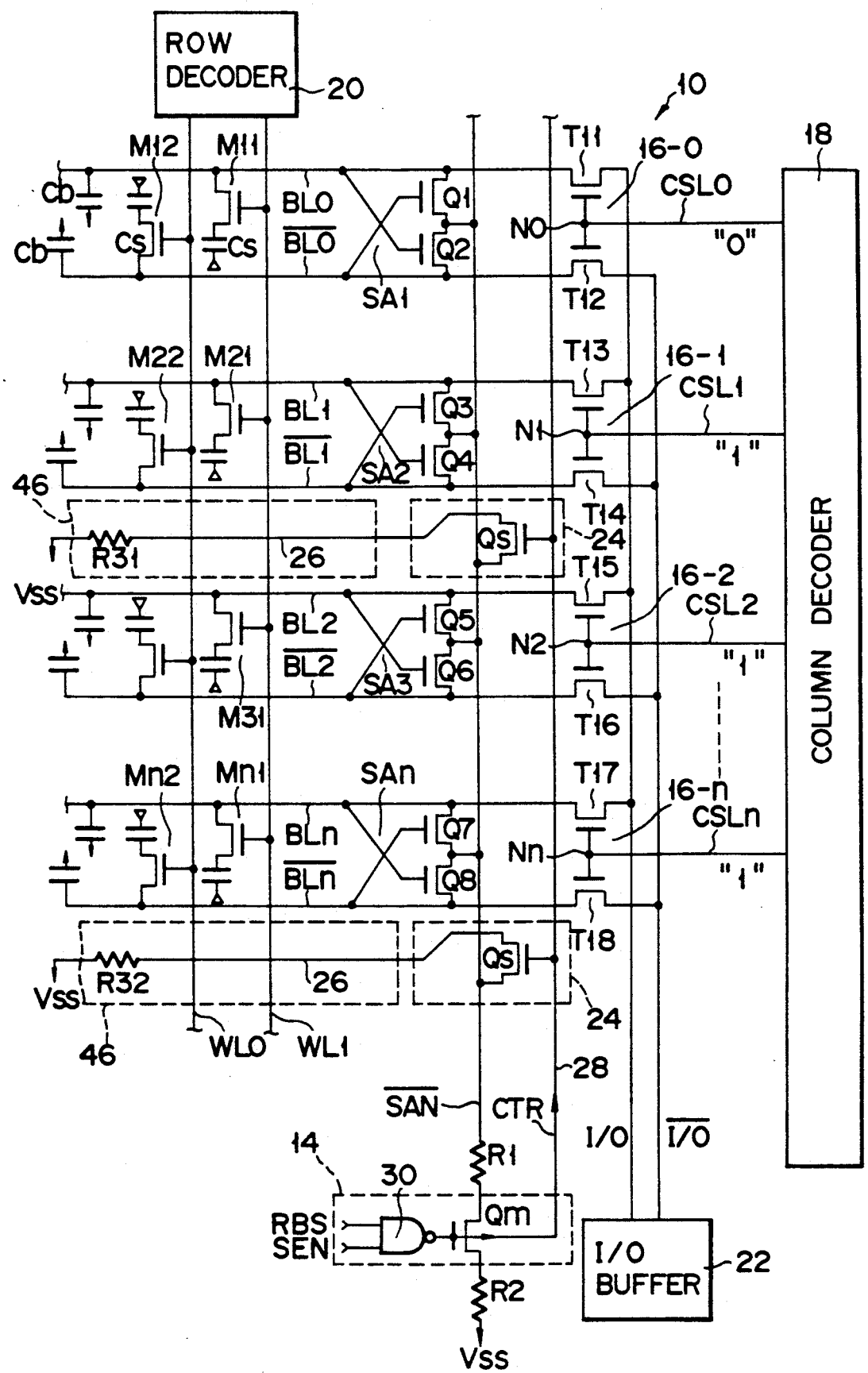
F I G. 1

DYNAMIC RANDOM ACCESS MEMORY WITH ENHANCED SENSE-AMPLIFIER CIRCUIT

BACKGROUND OF THE INVENTION

1. Field of the Invention

The present invention relates to semiconductor memory devices, and more particularly, to dynamic random access memories (DRAMs) having memory cells each comprising one transistor and one capacitor.

2. Description of the Related Art

Of semiconductor memory devices having metal oxide semiconductor (MOS) transistors integrated on a chip substrate, DRAMs having a memory structure with one transistor and one capacitor are most suitable for high integration due to their small memory-cell occupying area. DRAMs of several megabits to several tens of megabits fabricated according to an advanced micro-fabrication using a submicron working technique dealing with the minimum work size of 1 micrometer or less have recently been announced and will be mass-produced in near future.

There is a strong demand of higher operational speed for such highly integrated DRAMs. With the state-of-the-art technology, however, the operational speed cannot be further increased by improving the switching speed of micro-fabricated MOS transistors alone. This is because micro-fabrication of MOS transistors is naturally limited, and the super micro-fabrication technique, which has already been developed, requires a special fabrication process and there is no little risk for semiconductor manufacturers in applying this technique to mass production of semiconductor devices at the present stage.

It is well known among those skilled in the art that the operational speed of DRAMs or reading/writing speed to access data is principally dependent on the sense time required to detect (or sense) memory cell data and amplify it. This sense time is influenced greatly by a data writing pattern in a memory array; the sense time for devices is generally specified by the length of time required for the data reading pattern under the worst conditions.

The most typical "data reading pattern under the worst conditions" would be such that paying attention to an array of memory cells respectively included in plural pairs of data transmission lines, called the "bit line pairs," and arranged along, and associated with, a certain data row control line, called the "word line," data stored in a selected memory cell in the array is of logical "0" and data of logical "1" is stored in all the remaining memory cells. Such a data storage pattern is generally called the "column bar pattern."

In this case, a discharge current flowing from bit lines connected with non-selected memory cells into a common source line commonly provided to the bit line pairs before discharge current flows into the bit line connected with the selected memory cell (this current will be hereinafter called "read discharge current") becomes largest. An increase in such a read discharge current delays the sensing operation in a sense amplifier section connected to the common source line for the following reasons.

As the common source line extends in parallel to the word lines above the chip substrate, its line resistance is obviously large. The greater the memory integration of a DRAM, the greater the number of the bit line pairs associated with the common source line, thus further increasing the line resistance of the common source line as well as the capacitance thereof. In other words, the discharge time constant of the common source line becomes relatively large. Under such circumstances, an increase in the read discharge current increases the time required for the discharge current in the read operation to quench. The sense operation for a selected memory cell is executed after a certain length of time has elapsed since the discharge current starts to flow in the bit line connected to the remaining, unselected memory cells in order. The timing of driving a column select line for the selected cell is therefore significantly delayed. This inevitably increases the total time required to complete the logical discrimination of data stored in the selected memory cell, which is simply the actual time required for the sense operation for the selected cell. Such a delay in timing of driving the column select line in the case of the column bar pattern considerably hinders the high speed data accessing operation of a DRAM, which raises a significant problem.

SUMMARY OF THE INVENTION

It is therefore an object of the present invention to provide a new and improved dynamic random access memory device which is capable of maximizing the data access speed without degrading its memory integration density and which can be manufactured using a presently available micro-fabrication technique.

In accordance with the above object, the present invention is addressed to a specific dynamic random access memory which has a substrate, parallel bit lines provided on the substrate, parallel word lines insulatively crossing the bit lines on the substrate to define cross points therebetween, and memory cells provided at the cross points. Each of these memory cells has a data storage capacitor and a transistor. A sense amplifier circuit section is connected to the bit lines, for sensing a data voltage. A discharge control section is associated with the sense amplifier circuit section, for forming a discharge path branched between the bit lines and a ground potential when a certain word line is specified and a memory cell is selected from those memory cells connected to the certain word line, thereby progressing discharging of charges.

The present invention and its objects and advantages will become more apparent from a detailed description of preferred embodiments presented below.

BRIEF DESCRIPTION OF THE DRAWINGS

In the detailed description of preferred embodiments of the present invention presented below, reference is made to the accompanying drawings of which:

FIG. 1 is a schematic diagram illustrating the internal circuit configuration of a dynamic random access memory (DRAM) according to one preferred embodiment of the present invention;

DETAILED DESCRIPTION OF THE PREFERRED EMBODIMENTS

Figure 2:
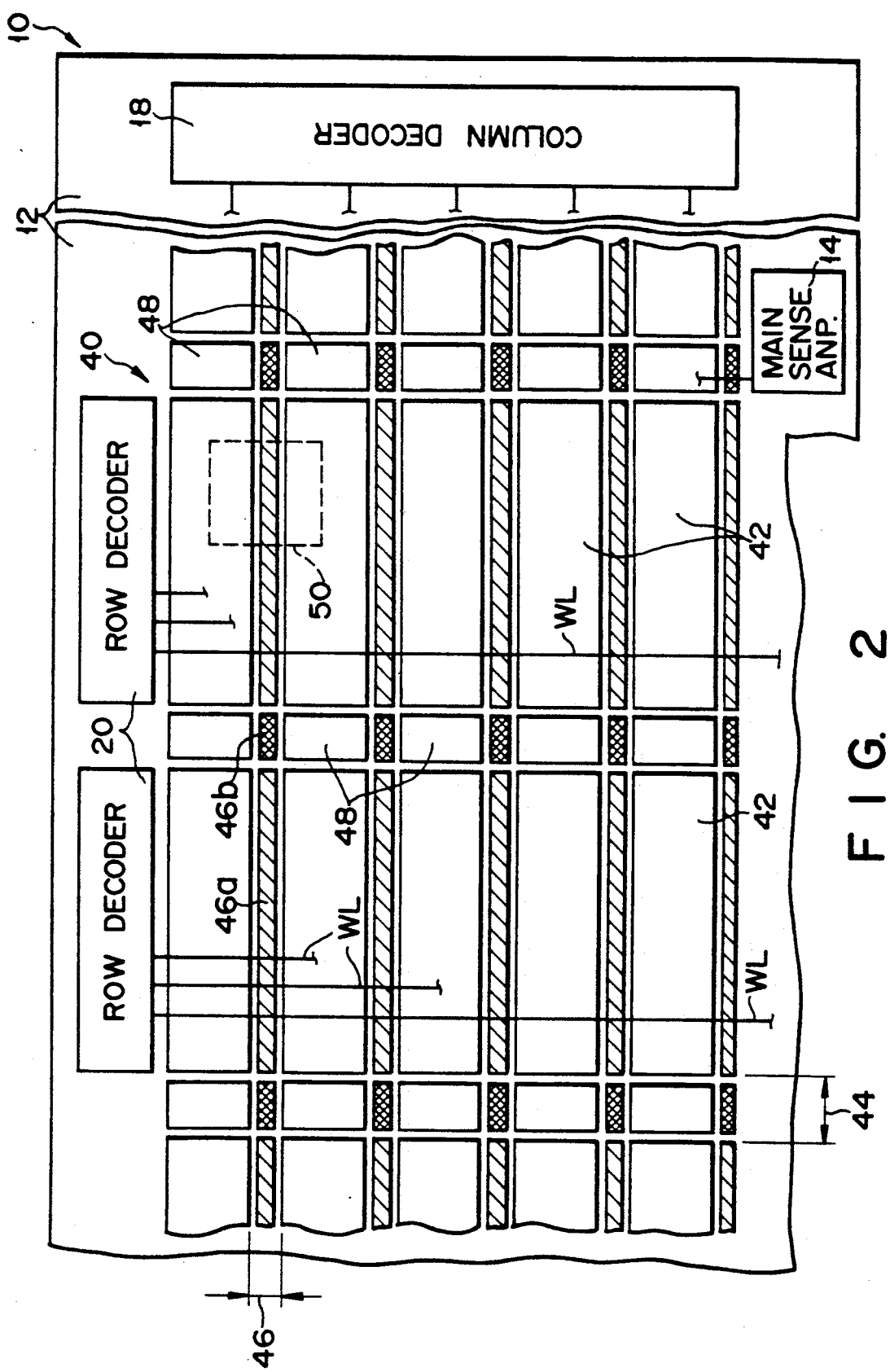
FIG. 2 is a diagram presenting a plane view of the essential portion of the DRAM in FIG. 1 including a memory section.
Figure 3:
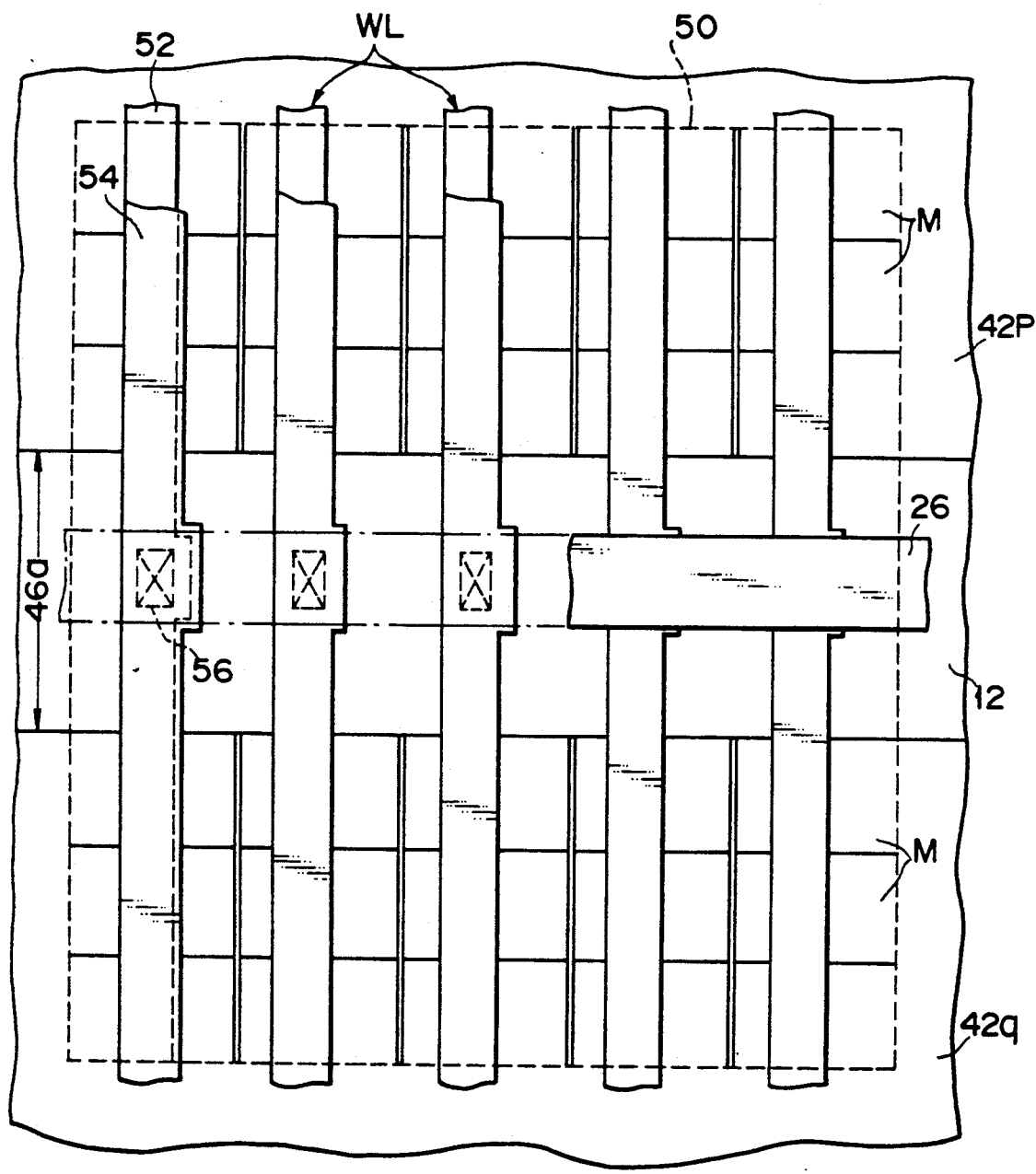
FIG. 3 is an enlarged, deformed diagram of a plane pattern of part of the plane structure of the DRAM in FIG. 2 for easier understanding.

In FIG. 1, a DRAM according to one preferred embodiment of the present invention is generally designated by reference numeral "10." The DRAM 10 has a first preselected number of bit line pairs BL, $\overline{BL}$ on a chip substrate 12 (which is shown in FIGS. 2 or 3). Each bit line pair has first data transmission lines BLi (i=1, 2, ..., n) and second data transmission lines $\overline{BLi}$ (i=0, 1, 2, ..., n), which are parallel to one another. There are a second preselected number of word lines WL which insulatively cross or intersect the bit line pairs BL, $\overline{BL}$, although FIG. 1 only shows two word lines WL0, WL1 for the sake of a diagrammatic convenience.

Memory cells M11, M12, ... are provided at the cross points between each word line WLj (j=0, 2, ..., n) and the first data transmission lines BL0, BL1, BL2, ..., BLn. Each of the memory cells has a well know structure with one MOS transistor and one MOS capacitor, as shown in FIG. 1. In FIG. 1, the capacitances of the memory cell capacitors are indicated here and there by "Cs," and the line capacitances of each bit line pair BLi, $\overline{BLi}$ by "Cb."

As shown in FIG. 1, bit line pairs BL, $\overline{BL}$ are respectively provided with sense amplifiers SA1, SA2, SA3, ..., SAn. Each sense amplifier SAi has two MOS transistors Q connected as illustrated. For instance, the sense amplifier SA1 has two series-connected MOSFETs Q1 and Q2, the MOSFET Q1 having its gate connected to the bit line $\overline{BL0}$ and the other MOSFET Q2 having its gate connected to the bit line BL0. The other sense amplifiers SA2, SA3, ..., SAn have the same structure except for different reference numerals given to their MOSFETs. The series-circuits of MOSFETs Q of the bit line pairs BL, $\overline{BL}$ have their common nodes connected together to a common source line $\overline{SAN}$, which is connected to a main sense amplifier driver 14.

The bit line pairs BL, $\overline{BL}$ are also provided with column select gate circuits 16-0, 16-1, 16-2, ..., 16-n, respectively. Each column select gate circuit 16-i has two MOSFETs Ti and T(i+1), the former connected to the bit line BLi of the corresponding bit line pair BL and the other connected to the remaining bit line $\overline{BL}$. For instance, in the column select gate circuit 16-0 of the bit line pair BL0, $\overline{BL0}$, the MOSFETs T11 is connected to the bit line BL0 while the MOSFETs T12 is connected to he bit line $\overline{BL0}$. These MOSFETs T11 and T12 have their gates connected together. The same is true of the remaining column select gate circuits 16-1, 16-2, ..., 16-n. The column select gate circuits 16-0, 16-1, 16-2, ..., 16-2 have their common gate nodes N0, N1, N2, ..., Nn connected through column select lines CSL0, CSL1, CSLn to the respective outputs of a column decoder 18. The column select gate circuits 16 may be driven independently in response to column select control signals CSL from the column decoder 18. Word lines WL are connected to the outputs of a row decoder 20 and are selectively designated or activated by this decoder.

As shown in FIG. 1, n bit line pairs BL, $\overline{BL}$ are connected to a pair of data input/output lines I/O and $\overline{I/O}$, which are connected to an input/output data buffer 22.

It should be noted that the main sense amplifier driver 14 is additionally provided with a preselected number of subsense amplifier drivers 24 and the common source line $\overline{SAN}$ is connected not only to the main sense amplifier driver 14 but also to these subsense amplifier drivers 24. Each subsense amplifier driver 24 includes a switching transistor Qs, such as a MOSFET. This MOSFET has its source is connected through a potential applying line 26 to a predetermined potential, for example, a substrate potential Vss and its drain connected to the common source line $\overline{SAN}$. The potential applying line 26 is grounded. The MOSFETs Qs of the subsense amplifier drivers 24 have their gates commonly connected to a gate control line 28, which is connected to the main sense amplifier driver 14. Accordingly, these MOSFETs Qs are turned on or off at the same time in response to an output from the main sense amplifier driver 14.

As shown in FIG. 1, the main sense amplifier driver 14 includes a logic circuit 30 called an "AND gate" which acquires a logical product. The AND gate 30 receives a row block select signal RBS at one input and receives a sense amplifier activate signal SEN at the other input. The AND gate 30 has its output connected to the gate of a switching transistor Qm constituted by a MOSFET. The MOSFETs Qm has its drain connected to the common source line $\overline{SAN}$ and its source connected to the ground potential Vss. Referring to FIG. 1, resistors R1 and R2 represent equivalent line resistors. Equivalent line resistors of the potential applying lines 26 are respectively designated by reference numerals "R31" and "R32."

Additional provision of the subsense amplifier drivers 24 principally gives the bit line pairs BL, $\overline{BL}$ an extra discharge current paths, which will be explained later.

Referring now to FIG. 2, a memory region 40 is defined on the chip substrate 12 of the DRAM 10. The aforementioned decoder circuits 18 and 20 are arranged around this region 40. Memory cell subblocks 42 having a rectangular plane outline are orderly arranged in a matrix form in the memory region 40. Each memory cell subblock 42 includes memory cells associated with a predetermined number of bit line pairs BL, $\overline{BL}$ as shown in FIG. 1. The word lines WL0, WL1, ... come out from the row decoders 20 for each column address.

Gap regions 44 remain between the memory cell subblocks 42 in the row direction, and gap regions 46 exist therebetween in the column direction. Sense amplifier regions 48 are defined in most of the column gap regions 44. Each sense amplifier region 48 includes the main sense amplifier drivers 14 for bit line pairs BL, $\overline{BL}$ of the associated memory cell subblocks 42.

The row gap regions 46 are generally called "snap regions" in the related field, where contact portions for the word lines WL are to be provided. Obviously, these gap regions 46 do not contribute at all to the layout of the memory cells of the DRAM 10, and are used only to provide the contact portions for the word lines WL but used in no other way. Each row gap region 46 has gap regions 46a between cell subblocks, hatched in oblique lines in FIG. 2 for the sake of convenience, and gap regions 46b between sense amplifiers, hatched in mesh. As no word lines WL are principally arranged above the gap regions 46b, these gap regions 46b may be considered "dead space" which is of no use for the time being.

It should be noted that the subsense amplifier drivers 24, explained referring to FIG. 1, are laid out particularly using these "dead space" regions 46b and the potential applying lines 26 associated with the drivers 24 are arranged in the regions 46a. With such an arrangement, the newly added subsense amplifier drivers 24 and potential applying lines 26 can be laid out on the chip substrate 12 very practically without the need to unnecessarily increase the size of the chip substrate 12 and without using a special design technique of microfabricating a wiring pattern.

The plane patterning structure of a square area 50 indicated by the broken-line in FIG. 2 is illustrated in detail in FIG. 3. Two neighboring memory cell blocks, say 42p and 42q, facing each other with the row gap region 46 in between, have a plurality of rectangular 1-bit memory cells M, which are arranged closely in the gap 46. The work lines WL run straight above the memory cells M. Each word line WL has a double-layered structure, which has a polycrystalline silicon layer 52 and an aluminum layer 54 insulatively stacked thereabove in this embodiment. Referring to FIG. 3, the underlying layer 52 is narrower than the overlying layer 54 rather for the purpose of emphasis for clearer illustration than as a result of the limitation of the electron beam focusing for patterning in the actual fabrication process.

A contact portion 56 is formed for each word line WL to render the overlying layer 54 and the underlying layer 52 mutually conductive. The aforementioned region 46b of the row gap region 46 is required for the layout of the contact portions 56 on the substrate 12. As shown in FIG. 3, the potential applying line 26 is provided above the line of contact portions 56, and the subsense amplifier drivers 24 are arranged particularly in the "dead space" region 46b surrounded by the sense amplifier regions 48 and the regions 46a, as shown in FIG. 2. It is therefore quite unnecessary to specially spare some of the precious substrate area for those additional constituting elements, which would result in reduction in memory integration. The potential applying lines 26 can be simultaneously formed through patterning from a metal layer that forms either the bit line pairs BL, $\overline{BL}$ or the column select lines CSL of the DRAM 10. This means that there is no need to add an extra patterning layer to form the potential applying lines 26.

A description will now be given of the data reading operation in the typical "column bar pattern" in the thus constituted DRAM 10. Suppose that, as an example of the "column bar pattern," a certain row address, e.g., the word line WL1, is designated, and data of logical "0" is sensed in the column of the bit line pair BL0, $\overline{BL0}$ while data of logical "1" is sensed in the all the remaining columns along the designated row address. This is the "worst case" for the data reading or the case for the lowest data accessing speed.

As shown in FIG. 4, the work line WL1 is selected at time t0 and the sense operation starts at time t1. At this time, the MOSFET Qm of the main sense amplifier driver 14 is turned on, in response to which the MOSFETs Qs of the subsense amplifier drivers 24 are simultaneously turned on. The MOSFETs Qs of the subsense amplifier drivers 24 are simultaneously turned on to be rendered conductive in response to a switch control signal CTR from the main sense amplifier driver 14. The common source line $\overline{SAN}$ is connected at a plurality of sections to the ground potential Vss through the MOSFETs Qs and the lines 26. In other words, the common source line $\overline{SAN}$ has a plurality of discharge paths.

Figure 4A:
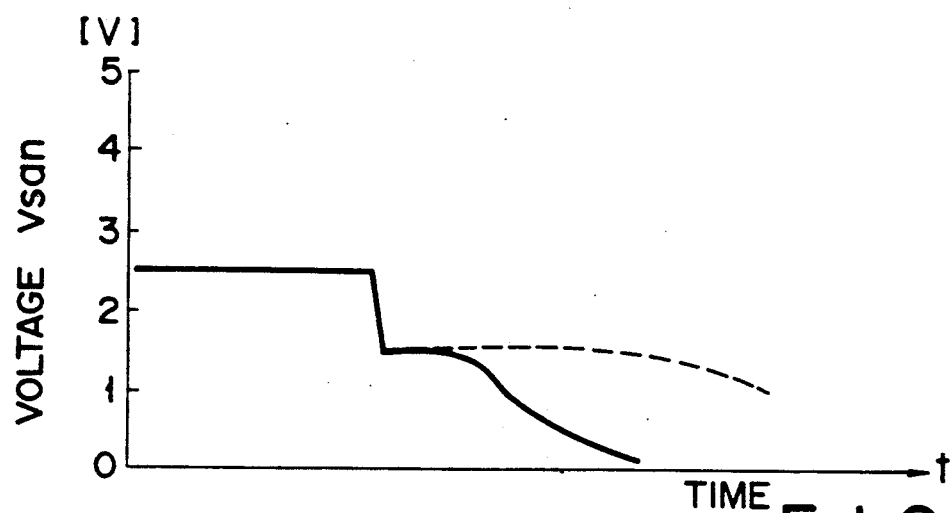
FIGS. 4A to 4C are graphs showing waveforms of electric signals generated at the essential portions in essential operation modes in the embodiment as shown in FIGS. 1 through 3.

When the MOSFETs Q4, Q6, ..., Q8 of the sense amplifiers SA2, SA3, ..., SAn in the column with data of logical "1" are turned on, the charges on the bit lines BL1, BL2, ..., BLn to which these MOSFETs Q are connected are rapidly discharged to the substrate 12 via the discharge paths of the common source line $\overline{SAN}$. The discharging of the charges is accelerated so that the potential of the line $\overline{SAN}$ drastically drops to the ground potential Vss from the precharged potential Vp, as shown in FIG. 4A. The broken line in this figure represents a change in potential of the common source line $\overline{SAN}$ in the prior art case.

Figure 4B:
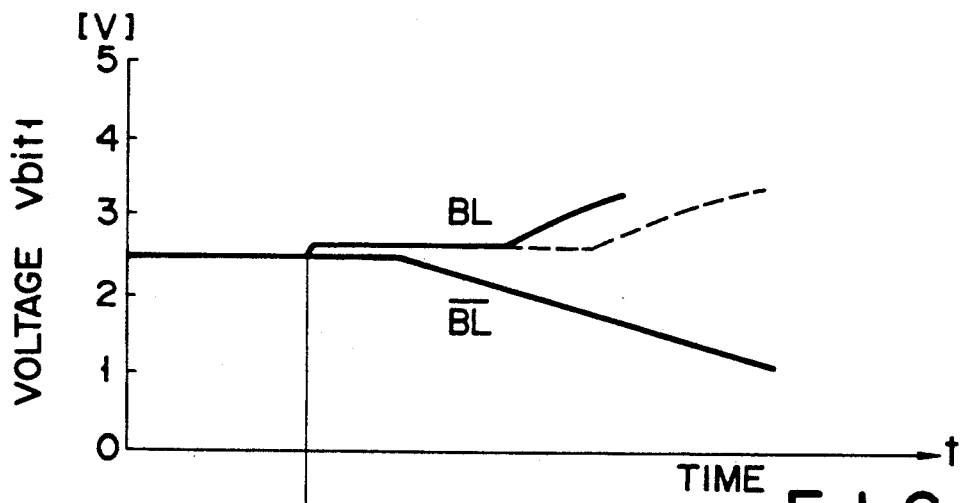

During a certain time period of discharging of the charges on the bit lines BL1, BL2, ..., BLn with "1" data, the MOSFET Q2 of the sense amplifier SA1 with the bit line BL0 is kept nonconductive. That is, the read data of the target column is not sensed until the discharging is executed for a predetermined discharge level. A change in potential Vbit1 of bit line pairs BL1, $\overline{BL1}$, BL2, $\overline{BL2}$, ..., BLn, BLn associated with the column with "1" data is illustrated in FIG. 4B wherein the solid lines are of the present invention and the broken lines is of the prior art.

Figure 4C:
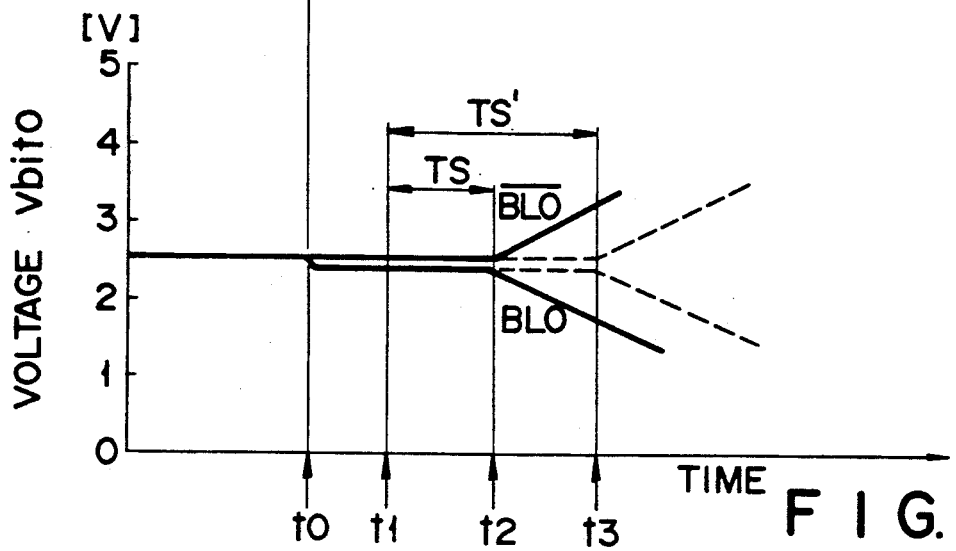

In the DRAM 10, the discharging of carriers from the bit lines of non-selected columns has been carried out at time t2, at which the MOSFET Q2 of the sense amplifier SA1 of the target column is therefore turned on. At this time, the sense operation starts and data "0" is read out. FIG. 4C shows a change in potential Vbit0 at the bit line pairs BL0, $\overline{BL0}$. The interval TS between times t1 and t2 corresponds to the actual "sense delay" in the target column. As should be obvious from the graph in FIG. 4C, the "sense delay" interval TS of the present invention, indicated by the solid lines, is shorter than the "sense delay" interval TS' of the prior art, indicated by the broken lines. This means an increase in the accessing speed of the DRAM 10.

Providing the discharge current paths from the bit lines at a number of locations in the row direction in the DRAM 10 can equivalently reduce the line resistances of the discharge paths. As a result, the clamp potential can be dropped and the discharge time constant can be made smaller at the same time, thus ensuring the shortening of the sense time of the column bar pattern.

The possible factors to determine the resistance of the common source line $\overline{SAN}$ are the turn on-resistances of the drive transistor Qm of the main sense amplifier driver 14 and the drive transistors Qs of the subsense amplifier drivers 24, and the line resistors R1, R2, R31, R32, ... of the line $\overline{SAN}$. The former turn-on resistance is determined mainly by the gate widths of the respective transistors. The gate width of the drive transistor Qs of the subsense amplifier driver 24 cannot be set larger than that of the drive transistor Qm of the main sense amplifier driver 14 in view of the layout area; naturally, the turn-on resistance of each transistor Qs is larger than that of the transistor Qm. In accordance with high integration of the DRAM 10, however, the word lines WL becomes longer and the number of the snap regions 46 per word line increases, thus making it possible to reduce the total ON resistance of the parallel-connected drive transistors Qs of those subsense amplifier drivers 24 which are provided according to the increase in the quantity of the snap regions 46. Accordingly, the total turn-on resistance of the parallel-connected transistors Qs can be made smaller.

With regard to the latter line resistors R1, R2, R31, R32, on the other hand, the resistance of each of resistors R31 and R32 is larger than the resistance (R1+R2) because the common source line $\overline{\text{SAN}}$ is wider and longer at the portion of the subsense amplifier driver 24 than at the portion of the main sense amplifier driver 14. Like in the case of the turn-on resistances, providing a number of the lines in parallel can make the total line resistance smaller.

The above design feature can significantly reduce the resistance of the common source line $\overline{\text{SAN}}$ to the desired level. FIGS. 4A to 4C illustrate changes in potential on the "1" data bit line pair and "0" data bit line pair; the solid lines in the figures represent data of the present invention while the broken lines represent the results of measurement in the prior art. As should be obvious from these graphs, the clamp potential is reduced and the discharge time constant is smaller than that of the prior art. Accordingly, the transistor Q1 of the sense amplifier of the column with "0" data is turned on at a quick timing.

The structure to "accelerate charge discharging" of the present invention needs at least a pair of a subsense amplifier driver 24 and a potential applying line 26. A considerably high speed operation can be expected even from a single pair of a subsense amplifier driver 24 and a potential applying line 26, although the effect would naturally be increased with an increase in the number of such pairs. In the case of a single pair, the discharge current may be uniformly distributed by providing the subsense amplifier driver 24 and potential applying line 26 at the opposite end of the common source line $\overline{\text{SAN}}$ to that portion where the main column select driver 14 is connected.

A combination of the feature of this "additional provision of the branching discharge path" and the feature of the "layout to save the substrate area," which has been described referring to FIGS. 2 and 3 can realize high-speed DRAMs at a low cost with the presently available fabrication technique while keeping a satisfactory high integration.

Figure 5:
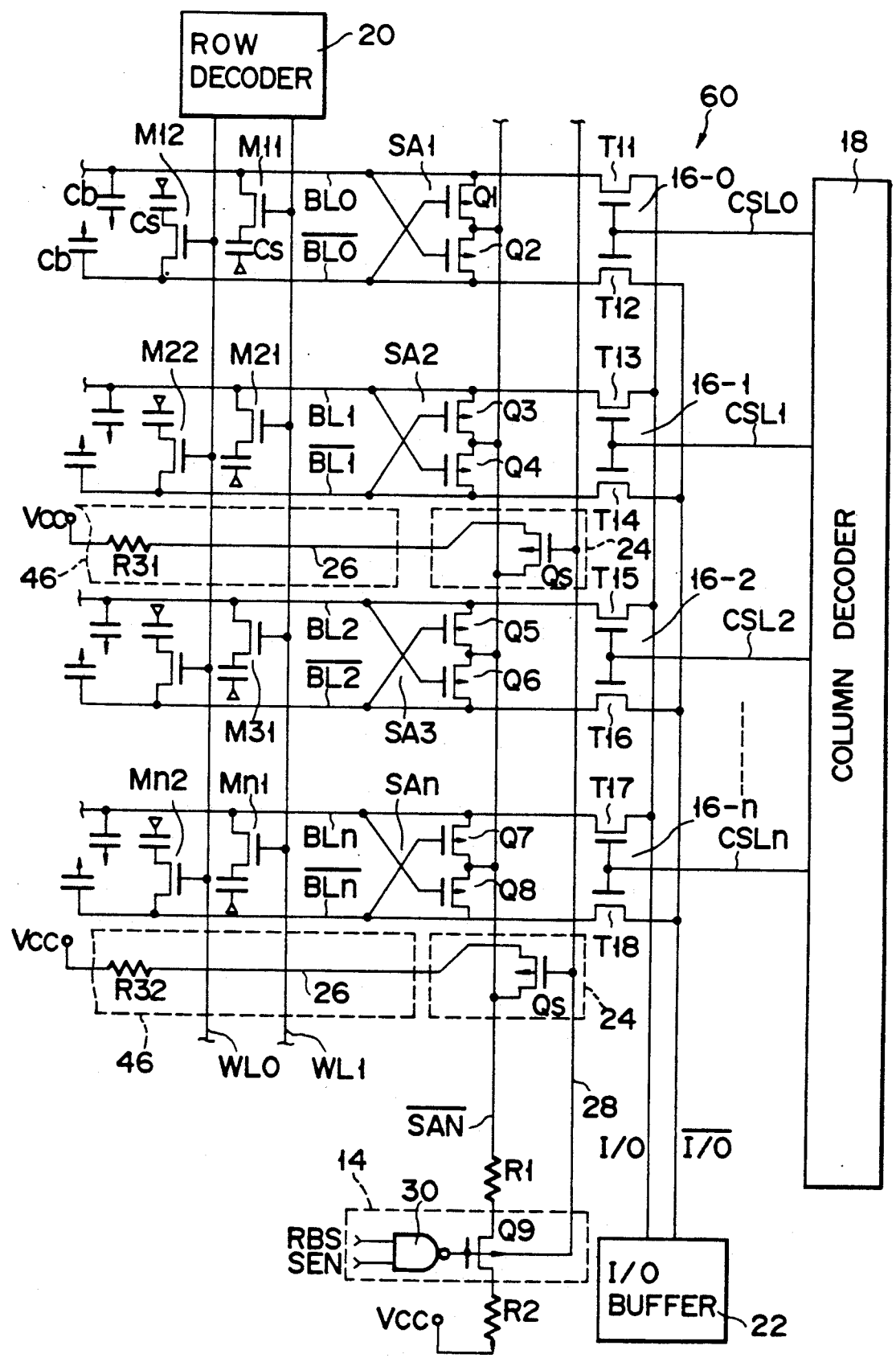
FIG. 5 is a schematic diagram illustrating the internal circuit configuration of a DRAM according to another embodiment of the present invention.

Although the above embodiment uses an NMOS sense amplifier to sense memory cell data, a PMOS sense amplifier may also be used. FIG. 5 illustrates a DRAM 60 with such a structure. The fundamental operation of the DRAM 60 is the same as that of the DRAM using an NMOS sense amplifier, except that the potential of the common source line $\overline{\text{SAN}}$ is raised to the source voltage Vcc, not the ground potential Vss, from the precharged potential Vp, to thereby activate the sense amplifiers SA and that the line for applying a potential to the main sense amplifier driver 14 and the distributed subsense amplifier drivers 24 is a power line, not the ground line.

What is claimed is:

1. A semiconductor memory device comprising:
   a substrate;
   parallel bit lines provided on said substrate;
   parallel word lines insulatively crossing said bit lines above said substrate to define cross points therebetween;
   memory cells provided at the cross points, each of said memory cells having a data storage capacitor and a transistor;
   sense amplifier means connected to said bit lines, for sensing a data voltage; and
   discharge control means, associated with said sense amplifier means, for forming a discharge path branched between said bit lines and a ground potential when a certain word line is specified and a memory cell is selected from those memory cells connected to said certain work line, thereby progressing discharging of charges.

2. The device according to claim 1, wherein said discharge control means comprises:
   a common line commonly connected to said sense amplifier means; and
   switch means, connected to said common line, for, when selectively rendered conductive, permitting charges on said bit lines to be discharged to flow therein.

3. The device according to claim 2, wherein said discharge control means further comprises discharge line means, connected to said switch means and kept at a selected constant potential, for discharging a discharge current.

4. The device according to claim 3, wherein said switch means includes a transistor.

5. The device according to claim 4, wherein said discharge line means includes a discharge line parallel to said bit lines, said discharge line being connected between said transistor and either a ground potential of said device or a source potential.

6. The device according to claim 3, wherein said switch means includes transistors connected in parallel.

7. The device according to claim 6, wherein said discharge line means includes a preselected number of discharge lines parallel to said bit lines, each of said discharge lines being connected between an associated one of said transistors and either a ground potential of said device or a source potential.

8. The device according to claim 3, wherein said memory cells are divided into a plurality of memory groups arranged to define gap spaces therebetween on said substrate, and said switch means and said discharge line means are arranged in selected regions in said gap spaces.

9. The device according to claim 8, wherein said word lines have a double-layered structure having a conductive overlying layer and a conductive underlying layer electrically connected together by contact portions, and said selected regions are defined on said substrate as regions where said contact portions are provided.

10. A dynamic random access memory comprising:
    a substrate having a memory area and a peripheral area;
    plural pairs of parallel bit lines provided on said substrate;
    parallel word lines crossing said bit line pairs in said memory area above said substrate to define cross points therebetween;
    memory cells provided at said cross points and each having a capacitor and a transistor;
    first decoder means for selectively designating said word lines;
    second decoder means for selectively designating said bit line pairs;
    sense amplifier means, provided for each of said bit line pairs, for sensing a data voltage; and
    sense amplifier driver means, connected to said sense amplifier means, for driving said sense amplifier means, said sense amplifier means comprising,
    a main driver provided in said peripheral area of said substrate, and
    at least one subdriver provided in said memory area of said substrate, said subdriver providing an additional charge discharge path with respect to said bit line pairs.

11. The memory according to claim 10, wherein said subdriver comprises discharge control means, associated with said sense amplifier means, for forming a discharge path branched between said bit lines and said substrate to progress charging of charges when a certain word line is designated and a memory cell is selected from those memory cells which are connected to said certain word line.

12. The device according to claim 11, wherein said discharge control means comprises:
   a common line commonly connected to said sense amplifier means;
   switching transistors, connected in parallel to said common line, for, when selectively rendered conductive, permitting charges on said bit lines to be discharged to flow therein; and
   a plurality of parallel potential applying lines, provided between said switching transistors and either a ground potential of said memory or a source potential, for discharging a discharge current to thereby form a branched discharge path.

13. The device according to claim 12, wherein said memory area is divided into a plurality of rectangular memory blocks each of which is divided into subblocks having a first selected number of rows and a second selected number of columns, first gap regions where contact portions for said word lines are arranged are defined between said subblocks to run in parallel to said bit line pairs, and second gap regions where said sense amplifier means is arranged are defined between said subblocks to run in parallel to said word lines.

14. The device according to claim 13, wherein said switching transistors are arranged together with said sense amplifier means in said second gap regions and said potential applying lines are arranged in said first gap regions.

* * * * *

UNITED STATES PATENT AND TRADEMARK OFFICE
CERTIFICATE OF CORRECTION

PATENT NO.   :  5,084,842
DATED        :  January 28, 1992
INVENTOR(S)  :  Tsuchida et al It is certified that error appears in the above-identified patent and that said Letters Patent is hereby corrected as shown below:

```
    Column 3,  line 53, change "he" to --the--.
    Column 5,  line 16, change "work line" to --word line--;
               line 55, change "work line" to --word line--.
    Column 8,  line 2, change "work line" to --word line--;
               line 64, change "said sense amplifier means"
to --said sense amplifier driver means--.
```

Signed and Sealed this

Sixth Day of September, 1994

Attest:

BRUCE LEHMAN

*Attesting Officer*      *Commissioner of Patents and Trademarks*